United States Patent [19]
Kumar

[11] Patent Number: 6,090,526
[45] Date of Patent: Jul. 18, 2000

[54] POLYMERS AND PHOTORESIST COMPOSITIONS

[75] Inventor: Uday Kumar, Natick, Mass.

[73] Assignee: Shipley Company, L.L.C., Marlborough, Mass.

[21] Appl. No.: 08/706,138

[22] Filed: Sep. 13, 1996

[51] Int. Cl.[7] ................................................. G03F 7/039
[52] U.S. Cl. .................... 430/285.1; 430/176; 430/192; 430/270.1; 430/287.1
[58] Field of Search ................................. 430/270.1, 176, 430/192, 287.1, 285.1

[56] References Cited

U.S. PATENT DOCUMENTS

| | | | |
|---|---|---|---|
| 4,491,628 | 1/1985 | Ito et al. | 430/176 |
| 4,810,613 | 3/1989 | Osuch et al. | 430/192 |
| 4,883,740 | 11/1989 | Schwalm et al. | 430/270.1 |
| 4,968,581 | 11/1990 | Wu et al. | 430/192 |
| 5,072,029 | 12/1991 | Hertler | 560/225 |
| 5,075,199 | 12/1991 | Schwalm et al. | 430/281.1 |
| 5,085,972 | 2/1992 | Vogel | 430/270.1 |
| 5,102,771 | 4/1992 | Vogel et al. | 430/270.1 |
| 5,120,633 | 6/1992 | Bauer et al. | 430/176 |
| 5,206,317 | 4/1993 | Hertler et al. | 526/220 |
| 5,212,047 | 5/1993 | Hertler et al. | 430/270.1 |
| 5,219,711 | 6/1993 | Anderson et al. | 430/176 X |
| 5,252,427 | 10/1993 | Bauer et al. | 430/270.1 |
| 5,262,281 | 11/1993 | Bauer et al. | 430/323 |
| 5,861,231 | 1/1999 | Barclay et al. | 430/270.1 |

FOREIGN PATENT DOCUMENTS

| | | |
|---|---|---|
| 0 476 865 A1 | 3/1992 | European Pat. Off. . |
| 0 601 974 | 6/1994 | European Pat. Off. . |
| 0 663 616 A2 | 7/1995 | European Pat. Off. . |
| 0 689 098 A1 | 12/1995 | European Pat. Off. . |
| 0 789 279 A1 | 8/1997 | European Pat. Off. . |

OTHER PUBLICATIONS

English translation of Tangetal (EP 0689098) United States Patent Office, Aug. 1998, 39 pages.

Hertler, et al., "Synthesis and Applications of Acid–Labile Acrylic Polymers", *Makromol. Chem., Macromol. Symp.* 64, pp. 137–149, 1992.

Kikuchi, et al., "Positive Chemical Amplification Resist for Deep UV Lithography", *Journal of Photopolymer Science and Technology*, vol. 4, No. 3, pp. 357–360, 1991.

Raymond, et al., "A Negative–Wroking Tonable Photoimaging Composition Based on Acid–Labile Acrylic Polymers", *Journal of Imaging Science and Technology*, vol. 36, No. 3, pp. 243–248, 1992.

*Primary Examiner*—Cynthia Hamilton
*Attorney, Agent, or Firm*—Peter F. Corless; Darryl P. Frickey; S. Matthew Cairns

[57] ABSTRACT

The present invention provides novel polymers and photoresist compositions that contain such polymers as a resin binder component. The polymers of the invention include repeating units that contain an acetalester or ketalester moiety. Preferred photoresists of the invention are chemically-amplified positive-acting compositions that contain a polymer with acetalester or ketalester unit as a resin binder component and that can react to provide solubility differences in the presence of photo-generated acid.

6 Claims, No Drawings

POLYMERS AND PHOTORESIST COMPOSITIONS

BACKGROUND OF THE INVENTION

1. Field of the Invention

The present invention relates to new polymers and use of such polymers as a resin binder component for photoresist compositions, particularly chemically-amplified positive-acting resists.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plentim Press, New York, ch. 2 and 4, both incorporated herein by reference for their teaching of photoresist compositions and methods of making and using the same.

While currently available photoresists are suitable for many applications, current resists also can exhibit significant shortcomings, particularly in high performance applications such as formation of highly resolved sub-micron and sub-half micron features.

More recently, "chemically-amplified" resists have become of increased interest, especially for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is provided, e.g., carboxyl or imide, which results in different solubility characteristics in exposed and unexposed areas of the resist coating layer.

Also recently interest has increased in photoresists that can be photoimaged with deep U.V. radiation. Such photoresists offer the potential of forming images of smaller features than may be possible at longer wavelength exposures. As is recognized by those in the art, "deep U.V. radiation" refers to exposure radiation having a wavelength in the range of about 350 nm or less, more typically in the range of about 300 nm or less. While a number of deep U.V. resists have been reported, the need clearly exists for new deep U.V. resists that can provide highly resolved fine line images.

SUMMARY OF THE INVENTION

The present invention provides novel polymers and photoresist compositions that comprise a photoactive component and such polymers as a resin binder component. Preferred photoresists of the invention are chemically-amplified positive resists that are imaged with deep UV wavelengths, including sub-250 nm and sub-200 nm wavelengths such as 248 nm and 193 nm.

Preferred polymers of the invention comprise phenolic units and at least one acetalester or ketalester repeating unit that is capable of undergoing a deprotection reaction in the presence of photogenerated acid. As is understood by those skilled in the art, the terms "acetalester" and "ketalester" refer to moieties having an acetal-type or ketal-type linkage as part of the ester moiety. For example, suitable acetalester and ketalester groups of polymers of the invention have the formula —C(=O)—O—CXY—O—R where X and Y are independently hydrogen or non-hydrogen substituents and R is any of a wide variety of substituents such as substituted or unsubstituted alkyl, aryl, etc. Preferably, a polymer contains acetalester and/or ketalester units that are directly pendant to the polymer backbone without a phenyl or other such aryl unit is not interposed between the polymer backbone and the acetalester/ketalester unit such as generally depicted in Formula I below where the acetalester/ketalester units are directly pendant from a polymer bridge group. That is, as used herein references to acetalester and/or ketalester units that are directly pendant indicate that a phenyl or other carbocyclic aryl unit is not interposed between the polymer backbone and the acetalester/ketalester unit. Even more preferably, a polymer contains acetalester and/or ketalester units that are directly pendant to the polymer backbone and, in addition to carbocyclic aryl units, no alkylene (particularly extended alkylene such as having three or more carbons) or other groups are interposed between the acetalester/ketalester unit and the polymer, again as generally depicted in Formula I below.

Particularly preferred are phenol-acetalester and phenol-ketalester copolymers that contain a high carbon content moiety, e.g. moieties that have about ≧75% mass being carbon, more preferably at least about 80 to 85% carbon. Especially preferred are copolymers that comprise 1) acetalester and/or ketalester units, 2) phenolic units, and 3) one or more of other units, preferably high carbon content units. Such polymers are highly useful in positive chemically-amplified photoresists and can exhibit decreased post-exposure shrinkage and enhanced resistance to aggressive etchants such as chlorine or fluorine-based etchants.

Also preferred for use in photoresist exposed at extremely short wavelengths (such as less than 200 nm) are polymers that contain alicyclic units rather than aromatic (such as phenyl) or other conjugated groups that would absorb the exposure radiation and thereby decrease photospeed and otherwise compromise lithographic properties. Preferred alicyclic units have from 5 to about 20 carbon atoms and include e.g. substituted and unsubstituted adamantyl, norbornyl and isobornyl.

The invention also provides methods for forming relief images, including methods for forming a highly resolved relief image such as a pattern of lines where each line has essentially vertical sidewalls and a line width of about 0.40 microns or less, or even about 0.25 microns or less. The invention further provides articles of manufacture comprising substrates such as a microelectronic wafer or a liquid crystal display or other flat panel display substrate having coated thereon the photoresists and relief images of the invention. Other aspects of the invention are disclosed infra.

DETAILED DESCRIPTION OF THE INVENTION

The polymers of the invention in general comprise at least one acetalester or ketalester repeating unit. Particularly preferred acetalester and ketalester units are of the following Formula I:

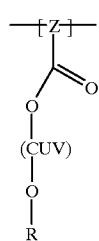

I wherein

U and V each independently may be hydrogen; halogen; substituted or unsubstituted alkyl, preferably having from 1 to about 20 carbons, more preferably having from 1 to about 8 carbons; substituted or unsubstituted alkenyl, preferably having from 2 to about 20 carbons, more preferably having from 2 to about 8 carbons; substituted or unsubstituted alkynyl, preferably having from 2 to about 20 carbons, more preferably having from 2 to about 8 carbons; substituted or substituted alkanoyl, preferably having from 1 to about 12 carbons, more preferably having from 1 to about 8 carbons; substituted or unsubstituted carbocyclic aryl, preferably having from 6 to about 24 carbons; substituted or unsubstituted aralkyl, preferably having from 7 to about 24 carbons; substituted or unsubstituted heterocyclic or heteroaromatic having 1 to 3 ring members and 1 to about 3 hetero atoms; and the like, and preferably with at least one of U or V being other than hydrogen;

R is substituted or unsubstituted alkyl, preferably having from 1 to about 20 carbons, more preferably having from 1 to about 15 carbons; substituted or unsubstituted alkenyl, preferably having from 2 to about 20 carbons, more preferably having from 2 to about 15 carbons; substituted or unsubstituted alkynyl, preferably having from 2 to about 20 carbons, more preferably having from 2 to about 15 carbons; substituted or substituted alkanoyl, preferably having from 1 to about 20 carbons, more preferably having from 1 to about 8 carbons; substituted or unsubstituted carbocyclic aryl, preferably having from 6 to about 24 carbons; substituted or unsubstituted aralkyl, preferably having from 7 to about 24 carbons; or substituted or unsubstituted heterocyclic or heteroaromatic having 1 to 3 ring members and 1 to about 3 hetero atoms, and the like;

or R and at least one of U and V may be taken together with the depicted interposed oxygen to form a ring structure, preferably an alicyclic structure having one, two or more rings, each ring having 4 to about 10 ring members and the U or V and R groups are substituted or unsubstituted alkylene or heteroalkylene (i.e. alkylene with a N, O or S linkage). For example, R and at least one of U and V may be taken together with the depicted interposed oxygen (i.e. the oxygen between the groups CUV and R) so as to form e.g. tetrahydropyranyl or tetrahydrofuranyl, i.e. acetalester/ketalester groups pendant to the polymer backbone of the formula —C(=O)—O—(2-tetrahydropyranyl) or —C(=O)—O—(2-tetrahydrofuranyl); and Z is a bridge group between polymer units, e.g. substituted or unsubstituted alkylene preferably having 1 to about 10 carbon atoms, more typically 1 to about 6 carbons, or more preferably 1 to about 3 carbons and optionally substituted by alkyl having 1 to about 3 carbons, or Z is a substituted or unsubstituted alkenyl or alkynyl, preferably having 2 to about 10 carbons and optionally substituted by alkyl having 1 to about 3 carbons.

In certain aspects of the invention, an acetalester or ketalester repeating unit also may be spaced from a polymer backbone with any of a variety of groups interposed between the acetalester or ketalester unit and the polymer backbone. Such polymers preferably have a phenoxy or other aryloxy unit positioned between the acetalester or ketalester unit and the backbone. For example, preferred polymers comprise units of the following Formula II:

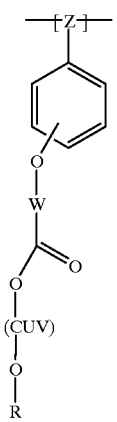

II wherein

W is a linker and may be e.g. a chemical bond; a substituted or unsubstituted alkylene group preferably having from 1 to about 12 carbons; a substituted or unsubstituted alkenylene preferably having from 3 to about 12 carbons; a substituted or unsubstituted alkynylene preferably having from 3 to about 12 carbons; and the like;

Z is a bridge group between polymer units, e.g. as discussed above with respect to Formula I, a substituted or unsubstituted alkylene linkage having 1 to about 6 carbon atoms, more typically 1 to about 3 carbons, optionally substituted by $C_{1-3}$ alkyl;

and U, V and R are each the same as defined above for Formula I. In certain aspects of the invention, groups of the above Formula II will be preferred, but with the proviso that one of U and V is other than hydrogen or alkyl when W is alkylene and R is alkyl. Also, in certain preferred aspects, a polymer will comprise units of the above Formula II together with acetalester/ketalester units that are directly pendant from a polymer backbone and/or with other units such groups of the Formulae IV through VIII below.

As discussed above, preferred polymers of the invention comprise phenolic units in addition to acetalester or ketalester units, such as polymers that comprise a structure of the following Formula III:

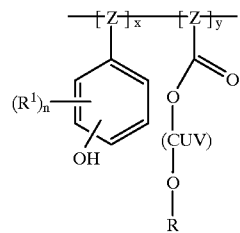

III wherein

U, V, R and Z are the same as defined above in Formulae I and II;

each $R^1$ is independently halogen (particularly F, Cl and Br), substituted or unsubstituted alkyl preferably having 1 to about 12 carbons, substituted or unsubstituted alkoxy preferably having 1 to about 12 carbon atoms, substituted or unsubstituted alkenyl preferably having 2 to about 12 carbon atoms, substituted or unsubstituted alkynyl preferably having 2 to about 12 carbons, substituted or unsubstituted alkylthio preferably having 1 to about 12 carbons, cyano, nitro, amino, hydroxyl, etc., or two $R^1$ groups on adjacent carbons may be taken together to form (with ring carbons to which they are attached) one, two or more fused aromatic or alicyclic rings having from 4 to about 8 ring members per ring (such as to form with the depicted phenyl a substituted or unsubstituted naphthyl or acenaphthyl ring); n is an integer of from 0 (where each phenyl ring is fully hydrogen-substituted) to 4, and preferably is 0, 1 or 2; x any y are mole fractions or percents of the respective units of the polymer. Preferably, x and y each will be within the range of from about 5 to 90 mole percent, more typically x will be from about 50 to 95.

A further group of preferred polymers of the invention contain a high carbon content moiety in addition to acetalester or ketalester units. Preferably, the high carbon moiety is at least about 75 mole percent carbon, and more preferably at least about 80 to 85 or even at least about 90 mole percent of the high carbon content moiety is carbon. Particularly preferred polymers include the following structure of Formula IV:

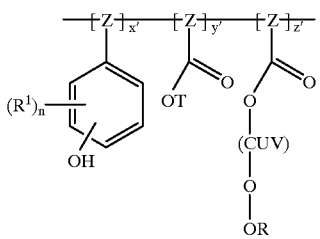

IV wherein

U, V, R and each Z are the same as defined above in Formulae I and II above; $R^1$ and n are each the same as defined in Formula III above;

T is a high carbon content moiety and may be e.g. a substituted or unsubstituted alkyl group having from about 4 to 20 carbons, and preferably is a cyclic group such as adamantyl, norbornyl, isobornyl and the like; or substituted or unsubstituted aryl, particularly carbocyclic aryl such as phenyl, naphthyl, acenaphthyl, anthracenyl, phenanthracenyl, etc.; or substituted or unsubstituted aralkyl such as benzyl, benzhydryl, etc.; or substituted or unsubstituted heterocyclic or heteroaromatic having 1 to 3 ring members and 1 to about 3 hetero atoms; and x', y', and z' are mole fractions or percents of the respective units of the polymer. Preferably, x' is from about 60 to 80 percent, and y' and z' are each from about 10 to 30 percent.

Additional preferred polymers that include high carbon groups comprise a structure of the following Formula V:

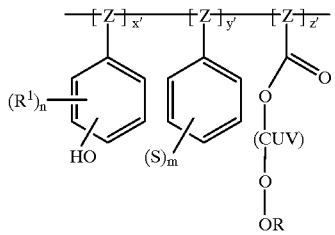

V wherein

U, V, R and each Z are the same as defined above in Formulae I and II above; $R^1$ and n are each the same as defined in Formula III above;

the S groups each suitably may be e.g. halogen; cyano; nitro; substituted or unsubstituted alkyl preferably having 1 to about 16 to 20 carbon atoms; substituted or unsubstituted alkoxy preferably having 1 to about 20 carbon atoms; substituted or unsubstituted alkenyl preferably having 2 to about 20 carbon atoms; substituted or unsubstituted alkynyl preferably having 2 to about 20 carbon atoms; substituted or unsubstituted alkylthio preferably having from 2 to about 20 carbon atoms; substituted or unsubstituted carbocyclic aryl such as phenyl, naphthyl, acenaphtyl, anthracenyl, phenanthracenyl, etc.; or substituted or unsubstituted aralkyl such as benzyl, benzhydryl, etc.; substituted or unsubstituted heterocyclic or heteroaromatic having 1 to 3 ring members and 1 to about 3 hetero atoms; or a sulfonic acid ester, such as a group of the formula —$OSO_2M$ where M is substituted or unsubstituted alkyl preferably having 1 to about 16 to 20 carbon atoms; substituted or unsubstituted alkoxy preferably having 1 to about 20 carbon atoms; substituted or unsubstituted alkenyl preferably having 2 to about 20 carbon atoms; substituted or unsubstituted alkynyl preferably having 2 to about 20 carbon atoms; substituted or unsubstituted alkylthio preferably having from 2 to about 20 carbon atoms; substituted or unsubstituted carbocyclic aryl such as phenyl, naphthyl, acenaphtyl, anthracenyl, phenanthracenyl, etc.; or substituted or unsubstituted aralkyl such as benzyl, benzhydryl, etc.; substituted or unsubstituted heterocyclic or heteroaromatic having 1 to 3 ring members and 1 to about 3 hetero atoms, etc.; or two S groups (typically on adjacent ring carbons) may be taken together to form one, two or more fused aromatic or alicyclic rings having from 4 to about 8 ring members per ring, e.g. two S groups can be taken together to form (together with the depicted phenyl) a naphthyl, acenaphtyl, anthracenyl or phenanthracenyl ring;

and m is an integer of from 0 (where the phenyl ring is fully hydrogen-substituted) to 5, and preferably is 0, 1 or 2; and x', y' and z' are mole fractions or percents of the respective units of the polymer.

Preferred S alkyl and other groups are high carbon moieties as discussed above with groups T of Formula IV and have at least about 4 carbon atoms. Alicyclic groups will be suitable such as substituted and unsubstituted adamantyl, norbornyl, isobornyl and the like, particularly for short wavelength exposure applications. Also, the polymer of Formula V may comprise a mixture of differing units with differing S units or no S units (i.e. m=0, although preferably m≧1) by using a variety of substituted or unsubstituted vinylphenyl monomers during the polymer synthesis.

Also, in each of Formulae II through V as well as Formulae VI through VIII and 10 and 11 below, the depicted hydroxyl ring substituent may be either at the ortho, meta or para positions throughout the polymer. Para or meta substitution is generally preferred.

In addition to the above-mentioned groups, a variety of other acetalester and ketalester groups can included in a polymer. For example, polymers that contain a repeating unit that consists of two or more actelester or ketalester groups are preferred, particularly phenolic copolymers such as polymers of the following Formula VI, VII and VIII:

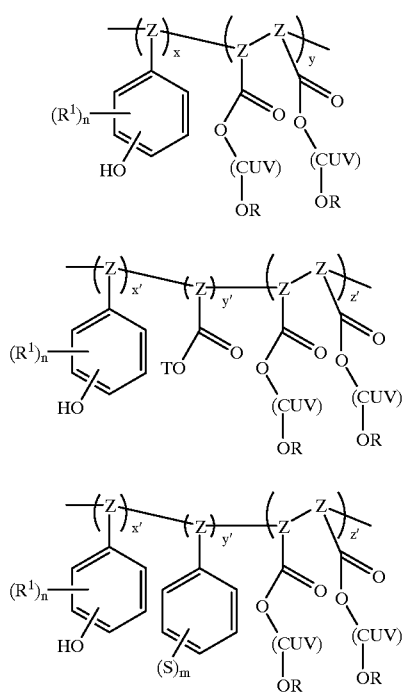

wherein for Formula VI the groups R, $R^1$, U, V and Z and coefficients n, x and y are the same as defined above for Formula III and each of the multiple acetalester/ketalester units may be the same or different; and for Formula VII the groups R, $R^1$, U, V, T and Z and coefficients n, x', y' and z' are the same as defined above for Formula IV and each of the multiple acetalester/ketalester units may be the same or different; and for Formula VIII the groups R, $R^1$, U, V, S and Z and coefficients m, n, x', y' and z' are the same as defined above for Formula V and each of the multiple acetalester/ketalester units may be the same or different.

Such polymers can be readily prepared. For example, diacid compounds can be reacted to provide multiple adjacent acetalester/ketalester units. Thus, for instance, citraconates, itaconates and fumarates, such as compounds 7, 8, and 9 below that may have a variety of R groups such as substituted and unsubstituted alkyl, aryl, alkoxy, etc.

including the illustrative R groups shown below, can be reacted to provide polymers of the invention. Particularly preferred polymers of formulae 10 and 11 below comprise condensed itaconate units (where $R_1$ is hydrogen and $R_2$ is methylene), fumarate units (where $R_1$ is hydrogen and $R_2$ is a bond) and citraconate units ($R_1$ is methyl and $R_2$ is a bond), with illustrative R groups shown below the formulae 10 and 11, and wherein the mole percents of the units (x and y, and x', y' and z' are the same as specified herein for other formulae). In formula 10 and 11, $R_1$ can be e.g. hydrogen, substituted or unsubstituted alkyl, alkenyl, aryl, etc, and typically is hydrogen or substituted or unsubstituted $C_{1-6}$ alkyl; and $R_2$ is a bond, substituted or unsubstituted alkylene or other interposed group, and more typically is a bond or alkylene such as $C_1$–$C_6$ alkylene. Terpolymers of formula 11 below include units T, which are preferably high carbon content units such as defined above for Formulae IV and include the illustrative groups depicted below (those groups formed by condensation of isobornylmethacrylate, diphenylmethylmethacrylate and styrene). A variety of other high carbon content T groups also will be suitable, such as those provided by condensation of vinylnaphthlene, adamantylmethacrylates, etc.

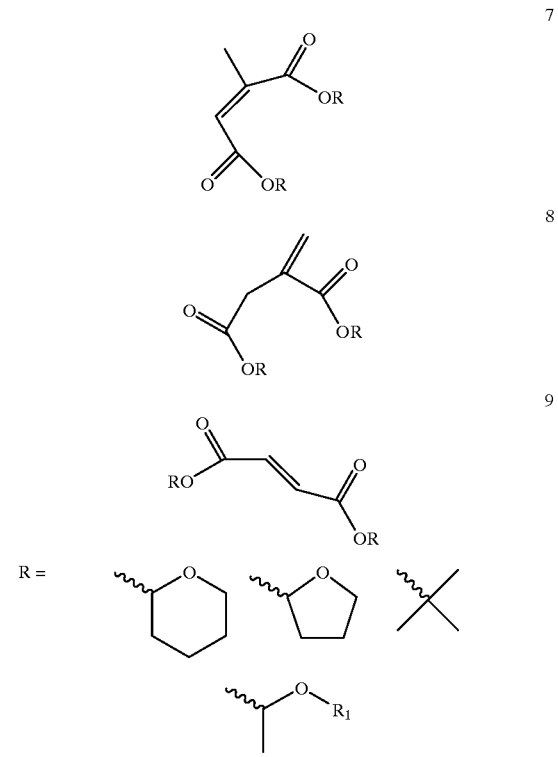

$R_1$ = alkyl chain or aromatic ring

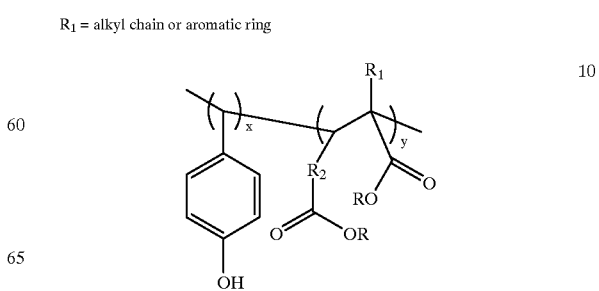

-continued

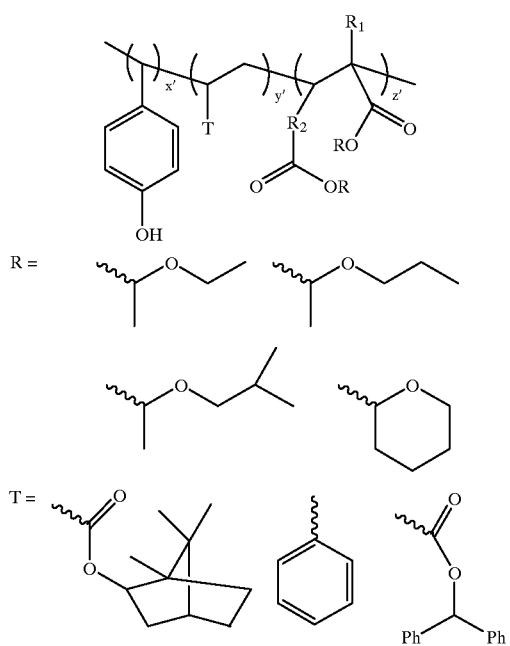

The above-mentioned substituted groups (including substituted groups Z, W, R, $R^1$, T, U, V, S, $R_1$, $R_2$ and other moieties) may be substituted at one or more available positions by one or more suitable groups such as halogen (particularly F, Cl or Br); $C_{1-12}$ alkyl; $C_{1-12}$ alkoxy; $C_{2-12}$ alkenyl; $C_{2-12}$ alkynyl; aryl such as phenyl; alkanoyl, e.g. a $C_{1-12}$ alkanoyl such as acyl; nitro; cyano; and the like. Typically a substituted moiety is substituted at one, two or three available positions.

Preferred polymers of Formulae II through VIII and 10 and 11 include those where the only polymer units correspond to the general structures depicted in those Formulae, i.e. in the case of Formula III, VI and 10 where the sum of x and y is about 100 percent; and in the case of each of Formulae IV, V, VII, VIII, and 11 where the sum of x', y' and z' is about 100 percent.

However, preferred polymers also may comprise additional units wherein the sum of such mole fractions would be less than one hundred. For example, a polymer may comprise condensed substituted or unsubstituted styrene or other vinyl aryl units to provide pendant substituted or substituted phenyl or other aryl units. In each of Formulae III, VI and 10, preferably the sum of x and y will be at least about 50 percent, more preferably at least about 70 or 80 percent. In each of Formulae IV, V, VII, VIII and 11, preferably the sum of x', y' and z' will be at least about 50 percent, more preferably at least about 70 or 80 percent.

Typically, a copolymer of the invention will contain at least about 2 to 3 mole percent of acetalester or ketalester units, more typically at least 5 mole percent of such units.

In the above formula, Z groups suitably will be substituted or unsubstituted alkylene preferably having 1 to about 10 carbon atoms, more typically 1 to about 6 carbons, or more preferably 1 to about 3 carbons and optionally substituted by alkyl having 1 to about 3 carbons, or Z is a substituted or unsubstituted alkenyl or alkynyl, preferably having 2 to about 10 carbons and optionally substituted by alkyl having 1 to about 3 carbons. Preferred Z groups include ethylene optionally substituted by $C_{1-3}$ alkyl such as methyl.

Preferred heteroaromatic and heterocyclic substituent groups of the above formulae include amidazole, furyl, thienyl, tetrahydrofuranyl, tetrahydropyranal, piperdinyl, pyridyl, pyrimidinyl, triazine, thiophene and the like.

In all the above formulae, it will be understood that alkyl, alkenyl and alkynyl each may be cyclic or straight or branched non-cyclic chains, unless otherwise specified. Exemplary cyclic groups include cyclohexnyl, isobornyl, norbornyl, adamantyl and the like.

Polymers of the invention can be prepared by a variety of methods. One suitable method is free radical polymerization, e.g., by reaction of a plurality of monomers to provide the various units as discussed above in the presence of a radical initiator under an inert atmosphere (e.g., $N_2$ or argon) and at elevated temperatures such as about 50° C. or greater, although reaction temperatures may vary depending on the reactivity of the particular reagents employed and the boiling point of the reaction solvent (if a solvent is employed). For example, for synthesis of a phenolic polymer, vinyl phenol and an acetalester or ketal ester of a substituted or unsubstituted acrylic acid can be polymerized under free radical conditions. Additional monomers (such as monomers containing high carbon content moieties, or other acid labile groups such as t-butyl or other alkyl acrylate units) can be copolymerized to the desired polymer. Such other monomers include e.g. substituted and unsubstituted isobornylmethacrylates, adamantylmethacrylates, diphenylmethylmethacrylates and styrenes as mentioned above.

Acetalester and ketalester monomers can be readily prepared by known methods, e.g. by acid catalyzed addition of vinyl ethers to substituted or unsubstituted acrylic acids. See, for example, G. N. Taylor et al., *Chem. Mat.*, 3:1031 (1991); J. E. Kearns et al., *J. Macromol. Sci.-Chem.*, A8:673 (1974). Cyclic vinyl ethers such as dihydropyran, dihydrofuran also can be reacted with substituted or unsubstituted acrylic acid to provide desired acetalester and ketalester monomers.

Also, to facilitate polymer synthesis, a monomer that contains a hydroxy or other reactive moiety may be reacted with the reactive moiety in "masked" form. for example, vinylphenylacetate may be employed as a "masked" form of hydroxystyrene. Other hydroxy masking or protecting groups also will be suitable such as alkylsilyl groups (to form silylethers with the hydroxy moiety), e.g. $(CH_3)_3Si$—, $(CH_3)_2(butyl)Si$—, $((CH_3)_3C)3Si$—, etc.; other alkyl esters, e.g. $CH_3CH_2C(=O)$—, etc. After reaction completion, the masking groups may be removed under basic conditions. For example, the formed polymer may be heated in the presence of $NH_4OH$, $NH_4OAc$, ammonium sulfite, glycidyl amide or other suitable base. See Example 3 which follows for an exemplary procedure.

Suitable reaction temperatures to conduct a free radical polymerization for any particular system can be readily determined empirically by those skilled in the art based on the present disclosure. A reaction solvent may be employed if desired. Suitable solvents include ketones such as acetone, alcohols such as propanols and butanols, aromatic solvents such as benzene, chlorobenzene, toluene and xylene, and ethers such as tetrahydrofuran. Dimethylsulfoxide and dimethylformamide are also suitable. The polymerization reaction also may be run neat. A variety of free radical initiators may be employed to prepare the polymers of the invention. For example, azo compounds may be employed such as 2,2'-azobis-2,4-dimethylpentanenitrile, azo-bis-2,2'-isobutyronitrile (AIBN) and 1,1'-azobis (cyclohexanecarbonitrile). Peroxides, peresters, peracids and persulfates also can be employed.

Preformed resins also may be modified to provide a polymer of the invention. For example, a phenolic resin such as a novolac or poly(vinylphenol) may be condensed to provide pendant acetalester or ketalester units. More specifically, a poly(vinylphenol) may be condensed with the appropriate ester in the presence of base to provide pendant acetalester or ketalester units grafted onto phenolic groups (such as polymers of Formulae II and VIII above). Also, such a performed resin may be condensed with a compound that combines with the polymer's hydroxyl groups to form groups S in Formula V above. For example, if the moiety is a sulfonic acid ester (e.g. where S includes —OS(O)$_2$— in Formula V), a sulfonic acid halide is added to a solution of the preformed polymer in the presence of a suitable base and the mixture stirred typically with heating. A variety of bases may be employed for the condensation reaction including guanidine, hydroxides such as sodium and potassium hydroxides, carbonates such as guanidine carbonate, $K_2CO_3$ and $CS_2CO_3$, and the like. The condensation reaction is typically carried out in an organic solvent. A variety of organic solvents are suitable as would be apparent to those skilled in the art. Ethers such as diethyl ether and tetrahydrofuran, dimethyl formamide and ketones such as methyl ethyl ketone and acetone are preferred. Suitable conditions for the condensation reaction can be determined based upon the constituents used. The percent substitution of the preformed polymer with the high carbon content moiety can be controlled by the amount of the moiety precursor (e.g., the sulfonic acid halide as discussed above) condensed with the polymer. The percent substitution of the polymer can be readily ascertained by proton and $^{13}C$ NMR as well as thermal gravimetric analysis (TGA).

Preferably a polymer of the invention will have a weight average molecular weight (Mw) of 1,000 to about 100,000, more preferably about 2,000 to about 30,000 with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

As discussed above, polymers of the invention are highly useful as the resin binder component in photoresist compositions, particularly chemically-amplified positive resists. Photoresists of the invention in general comprise a photoactive component and a resin binder component that comprises the above-described copolymer.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Generally, sulfonate compounds are preferred PAGs, particularly sulfonate salts. Two specifically preferred agents are the following PAGS 1 and 2:

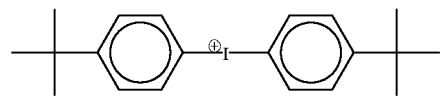

1

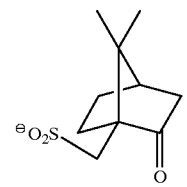

2

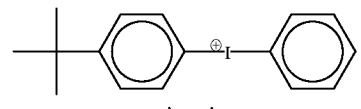

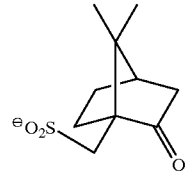

Such sulfonate compounds can be prepared as disclosed in Example 14 which follows, which details the synthesis of above PAG 1. Sulfonate PAG 2 above can be prepared by the same procedures of Example 14 which follows, except approximately molar equivalents of t-butyl benzene and benzene would be reacted together in the first step with acetic anhydride and $KIO_3$. Also preferred are the above two iodonium compounds with counter anions of perfluorooctanesulfonate in place of camphor sulfonate.

Other suitable sulfonate PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Onium salts are also generally preferred acid generators of compositions of the invention. Onium salts that are weakly nucleophilic anions have been found to be particularly suitable. Examples of such anions are the halogen complex anions of divalent to heptavalent metals or nonmetals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442,197; 4,603,101; and 4,624,912.

Other useful acid generators include the family of nitrobenzyl esters, and the s-triazine derivatives. Suitable s-triazine acid generators are disclosed, for example, in U.S. Pat. No. 4,189,323.

Halogenated non-ionic, photoacid generating compounds also may be suitable such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-

(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl) phosphorothionate; 1,2,3,4,5,6-hexachlorocyclohexane; N(1,1-bis[p-chlorophenyl]-2,2,2-trichloroethyl)acetamide; tris[2,3-dibromopropyl]isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators preferred for deep U.V. exposure include 1,1-bis(p-chlorophenyl)-2,2,2-trichloroethane (DDT); 1,1-bis(p-methoxyphenol)-2,2,2-trichloroethane; 1,1-bis (chlorophenyl)-2,2,2 trichloroethanol; tris(1,2,3-methanesulfonyl)benzene; and tris(trichloromethyl)triazine.

A preferred optional component of resist compositions of the invention is a dye compound. Preferred dyes can enhance resolution of the patterned resist image, typically by reducing reflections and the effects thereof (e.g. notching) of the exposure radiation. Preferred dyes include substituted and unsubstituted phenothiazine, phenoxazine, anthracene and anthrarobin compounds. Preferred substituents of substituted phenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g., an anthracene acrylate polymer or copolymer. A curcumin dye also may be used for some applications. Rather than a separate composition component, such dyes also can be incorporated directly into the copolymer, e.g. where two adjacent $R^1$ moieties of units of the above formulae together form a fused ring to provide an acenaphthyl moiety or the like. In addition to reducing reflections in deep U.V. exposures, use of a dye may expand the spectral response of the compositions of invention including beyond 248 nm or other deep UV wavelengths, such as to 365 nm or 436 nm exposure wavelengths.

Another preferred optional additive is an added base, particularly tetrabutylammonium hydroxide (TBAH), or the lactate salt of TBAH, which can enhance resolution of a developed resist relief image. The added base is suitably used in relatively small amounts, e.g. about 1 to 20 percent by weight relative to the photoactive component (PAG).

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, a glycol ether such as 2-methoxyethyl ether (diglyme), ethylene glycol monomethyl ether, ethylene glycol monomethyl ether, propylene glycol monomethyl ether; a Cellosolve ester such as methyl ethyl ketone; and 3-ethoxy ethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 300 mJ/cm$^2$, dependent upon the exposure tool and the components of the photoresist composition.

Coating layers of the resist compositions of the invention are preferably photoactivated by an exposure wavelength in the deep U.V. range i.e., 350 nm or less, more typically in the range of about 300 nm or less, typically about 150 to 300 or 450 nm. A particularly preferred exposure wavelength is about 248 nm. As discussed above, polymers of the invention also will be useful for resists imaged at wavelengths less than about 200 nm, such as 193 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $CF_4$ or $CF_4/CHF_3$ etchant applied as a plasma stream. After such processing, resist may be removed from the processed substrate using known stripping procedures.

All documents mentioned herein are fully incorporated herein by reference. The following non-limiting examples are illustrative of the invention.

EXAMPLE 1

A solution of 4-hydroxystyrene (58.54 g, 0.488 moles), 1-propyloxy-1-ethylmethacrylate (11.39 g, 0.066 moles) and isobornylmethacrylate (10.70 g, 0.048 moles) in tetrahydrofuran (235 ml) contained in a 500 ml flask was deaerated with nitrogen for 15 minutes. Then a solution of 2,2'-azobis2,4,dimethylpentanenitrile, (4.48 g, 0.018 moles) in 5 ml tetrahydrofuran was added to the flask and the ensuing stew was placed in a preheated oil bath and refluxed for 20 hours. The reaction mixture after cooling is precipitated into a nonsolvent comprised of hexane (800 ml) methylenechloride (2400 ml) and stirred for 3 hours. The precipitate was filtered and slurried with 300 ml methylene chloride for 8 hours. The polymer was finally filtered and dried in a vacuum oven at 45° C. for 6 hours.

EXAMPLE 2

The procedures of Example 1 above were followed using 2,2'-azobisisobutyronitrile as a initiator for 30 hours. The reaction mixture after cooling was precipitated into water containing 5% isopropanol. The precipitated polymer was filtered and dried in a vacuum oven at 45° C. for 6 hours. The properties of the polymer were identical to the one made by the above method of Example 1.

EXAMPLE 3

A solution of 4-acetoxystyrene 5 (58.97 g, 0.364 moles), 1-propyloxy-1-ethylmethacrylate (12.86 g, 0.0748 moles) and isobornylmethacrylate (13.28 g, 0.060 moles) in tetrahydrofuran (215 ml) was purged with nitrogen for 15 minutes. A solution of 2,2'-azobis2,4-dimethylpentanenitrile (3.71 g, 0.015 moles) in 5 ml tetrahydrofuran was added and the flask placed in a preheated oil bath and refluxed for 20 hours. The reaction mixture after cooling was precipitated into hexane (3 L) and stirred for 4 hours. The precipitate was filtered and slurried with 500 ml hexane for 8 hours. The polymer (Formula IV where n is 0 and the depicted phenolic group is protected with —C(=O)CH$_3$, T is isobornyl, R is propyl, U is hydrogen and V is methyl) was finally filtered and dried in the vacuum oven at 45° C. for 6 hours. The acetoxy terpolymer then can be hydrolyzed to the phenolic polymer.

EXAMPLES 4–13

Physical characteristics of exemplary preferred polymers of the invention (polymers of Examples 4–13) are set forth in Tables 1–3 below. The polymers were prepared by free radical polymerization of the corresponding monomers by procedures as described in the above examples. The Tables specify the R substituent, mole percentages x, y, z, glass transition temperature (Tg), decomposition temperature (Td) as determined by onset of first weight loss as measured by TGA, weight average molecular weight (Mw) as measured by gel permeation chromatography and dissolution rate (DR) of the polymer corresponding to the structure shown directly above the respective Table. In each of Tables 2 and 3, the second DR listed in the far right column is that an ethyl lactate formulation containing the polymer and 4 wt % di-t-butylphenyliodonium camphor sulfonate. The structure of the R groups of the polymers specified in the Tables is shown immediately below, i.e. THP is tetrahydropyran; EE is ethyl ether; PE is propyl ethyl ether; and IBE is isobutyl ethyl ether, substituted on the polymer at the positions immediately shown below.

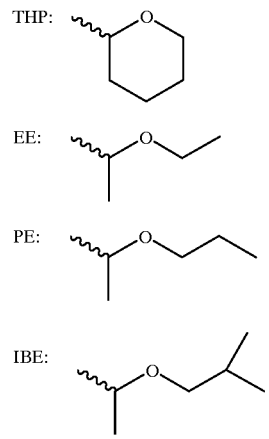

TABLE 1

| Example No. | R | x % | y % | z % | T$_g$ ° C. | Td ° C. | M$_w$ | DR Å/sec |
|---|---|---|---|---|---|---|---|---|
| 4 | EE | 63 | 27 | 10 | — | 135 | | 23 |
| 5 | PE | 70 | 18 | 12 | 127 | 133 | | |
| 6 | IBE | 66 | 17 | 17 | — | 127 | 6500 | 150 |

TABLE 2

| Example No. | R | x % | y % | z % | T$_g$ ° C. | Td ° C. | M$_w$ | DR Å/sec | D.R. Å/sec |
|---|---|---|---|---|---|---|---|---|---|
| 7 | PE | 74 | 12 | 14 | 135 | 142 | 7000 | 91 | 2.0 |
| 8 | IBE | 76 | 9.5 | 14.5 | 145 | 163 | 7500 | 41 | 1.5 |
| 9 | THP | 72 | 12 | 16 | 135 | 138 | 6500 | 73 | 2.0 |

TABLE 3

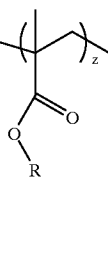

| Example No. | R | x % | y % | z % | $T_g$ °C. | Td °C. | $M_w$ | DR Å/sec | D.R. Å/sec |
|---|---|---|---|---|---|---|---|---|---|
| 10 | EE | 75 | 12 | 13 | 140 | 145 | 7000 | 69 | — |
| 11 | PE | 72.5 | 11 | 16.5 | 145 | 145 | 8000 | 28 | 1.5 |
| 12 | IBE | 78 | 10 | 12 | 150 | 155 | 8000 | 17 | 1.0 |
| 13 | THP | 72 | 13 | 15 | 132 | 135 | 7500 | 17 | 1.0 |

EXAMPLE 14

Preparation of di(4-t-butylphenyl)iodonium(±)-10-camphor sulfonate

The PAG 1 above can be prepared as follows. A 2 L 3 neck round bottom flask was charged with potassium iodate (214.00 g, 1.00 mol), t-butylbenzene (268.44 g, 2.00 mol) and acetic anhydride (408.36 g, 4.00 mol). The flask was fitted with an efficient overhead paddle stirrer, a thermometer and a pressure equalizing dropping funnel fitted with a $N_2$ bubbler. The reaction mixture was cooled to 10° C. in a ice-water bath and concentrated sulfuric acid (215.78 g, 2.20 mol) added dropwise via the addition funnel. The addition was carried out at such a rate as to maintain the reaction temperature around 25° C. and required 2 hours. As the addition proceeded the starting white suspension became orange-yellow in color. Once the addition was over, the reaction mixture was stirred at room temperature (20° C.) for an additional 22 hours. The reaction mixture was cooled to 5–10° C. and water (600 ml) was added dropwise over a period of 30 minutes, maintaining the temperature below 30° C. (Note the first @75 ml should be added at a particular slow rate as to control the initial exotherm, thereafter the rest of the water may be added at a faster rate). This cloudy mixture was washed with hexane (3×100 ml) (to remove unreacted t-butylbenzene and some 4-t-butyliodobenzene byproduct) in a 2 L separating funnel and the aqueous solution of diaryliodonium hydrogensulfate transferred to a 3 L reaction vessel. The solution was cooled to 5–10° C., (±)-10-camphorsulfonic acid (232.30 g, 1.00 mol) was added in one portion with stirring and the solution was then neutralized with ammonium hydroxide (620 ml, 9.20 mol). The amount of base used was the theoretical amount required to neutralize all acidic species in the pot, assuming quantitative reaction. The addition of the base is carried out at such a rate as to keep the temperature below 25° C. and takes about 1 hour. As the addition nears completion and the pH of the reaction mixture approaches 7, the crude diaryliodonium camphorsulfonate precipitated as a tan solid. This suspension was allowed to stir at room temperature for 3 hours and the material isolated as follows: The tan solid was collected by suction filtration and while still moist taken up in dichloromethane (1 L) and washed with dilute ammonium hydroxide (2.5 wt %, 5 ml 14.8 N $NH_4OH$+195 ml $H_2O$) until the washings are in the pH 7–8 range (1×200 ml) and then water (2×200 ml) to restore the pH to around 7. After drying ($MgSO_4$), the dichloromethane was removed under reduced pressure and the residue further dried in vacuo at 50° C. for 16 hours to give the crude product as a tan solid (390.56 g). The resulting tan solid was then purified by recrystallization in the following manner. The tan solid was dissolved in the minimum amount of refluxing isopropanol (@375 g PAG in @1150 ml IPA) in a 2 L round bottom flask to give a homogeneous dark red solution. The hot solution was transferred to a 2 L conical flask and allowed to cool. While this solution was still warm, hexane (500 ml) was added and crystals formed soon after. The crystallizing mixture was allowed to cool to room temperature and stored for 4 hours. The crystallizing solution was cooled to @5° C. in an ice-water bath for 1.5 hours and then the solid was collected by suction filtration and washed until white with very cold isopropanol-hexane (1:3, 2×200 ml, prepared by cooling the solvent mixture in a dry ice-acetone bath before use). The white solid was dried under aspirator vacuum for 1 hour until the PAG (di-(4-t-butylphenyl)iodonium (±)-10-camphor sulfonate) was isolated as a free flowing white powder. At this stage about 285 g of PAG is obtained. A second recrystallization can be performed in a similar manner.

EXAMPLE 15

Photoresist Preparation and Processing

Two photoresist compositions (Resists 1 and 2) were prepared by mixing the following components with amounts expressed as weight percents based on total weight of the resist composition.

| Resist Components (for both Resists 1 and 2) | Amount |
|---|---|
| resin binder | 15% |
| photoacid generator | 1% |
| basic additive | 0.1% |
| ethyl lactate | 83.9% |

In each of Resists 1 and 2, the resin binder was a polymer that contained 72 mole % 4-vinylphenol units 13 mole % methacrylate units and 15 mole % tetrahydropyranyloxy methacrylate units, and the basic additive was tetrabutylammonium hydroxide. In Resist 1, the photoacid generator was di-t-butylphenyliodonium camphorsulfonate (compound of above example), and in Resist 2 the photoacid generator was triphenylsulfonium triflate.

Resists 1 and 2 were each spin coated onto HMDA vapor primed 4 inch bare silicon wafers and softbaked via a vacuum hotplate at 90° C. for 60 seconds. The resist coating layers were exposed at 248 nm, post-exposure baked at 110° C. for 90 seconds via vacuum hot plate and developed with 0.26 N aqueous tetramethylammonium hydroxide solution. The exposure energy required to clear Resist 1 was 3.3 mJ/cm² and the exposure energy required to clear Resist 2 was 3.4 mJ/cm². Resist 1 formed well resolved 0.23 µm dense lines and 0.15 µm isolated lines, and Resist 2 formed well resolved 0.24 µm dense lines and 0.15 µm isolated lines.

The foregoing description of the invention is merely illustrative thereof, and it is understood that variations and modification can be made without departing from the spirit or scope of the invention as set forth in the following claims.

What is claimed is:

1. A photoresist composition comprising a photoactive component and a resin binder that comprises a polymer that comprises 1) phenolic units, and 2) acetal or ketal units directly pendant from the polymer backbone and that are capable of reaction upon photoactivation of the photoactive component, and wherein the polymer comprises one or more repeating units that contain multiple acetalester or ketalester group.

2. A photoresist of claim 1 wherein the polymer comprises a structure of the following Formula VI:

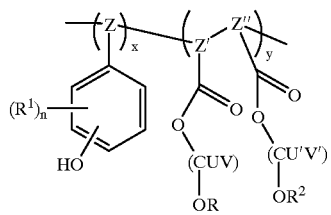

VI wherein

Z, Z' and Z" are each independently optionally substituted alkylene having 1 to about 10 carbon atoms, optionally substituted alkenyl having 2 to about 10 carbon atoms, or optionally substituted alkynyl having from 2 to 10 carbon atoms;

U, V, U' and V' are each independently is hydrogen; halogen; substituted or unsubstituted alkyl; substituted or unsubstituted alkenyl; substituted or unsubstituted alknyl; substituted or substituted alkanoyl; substituted or unsubstituted carbocyclic aryl; substituted or unsubstituted aralkyl; substituted or unsubstituted heterocyclic or heteroaromatic having 1 to 3 ring members and 1 to about 3 hetero atoms; and R and $R^2$ are each independently substituted or unsubstituted alkyl; substituted or unsubstituted alkenyl; substituted or unsubstituted alkynyl; substituted or substituted alkanoyl; substituted or unsubstituted carbocyclic aryl; substituted or unsubstituted aralkyl; substituted or unsubstituted heterocyclic or heteroaromatic having 1 to 3 ring members and 1 to about 3 hetero atoms;

or R and at least one of the U and V are taken together with the depicted interposed oxygen to form a ring, or $R^2$ and at least one of the U' and V' are taken together with the depicted interposed oxygen to form a ring;

each $R^1$ is independently halogen; substituted or unsubstituted alkyl; substituted or unsubstituted alkoxy; substituted or unsubstituted alkenyl; substituted or unsubstituted alkynyl; substituted or unsubstituted alkylthio; cyano; nitro; amino; hydroxyl; or two $R^1$ groups on adjacent carbons is taken together to form one or more fused aromatic or alicyclic rings having from 4 to about 8 ring members per ring; n is an integer of from 0 to 4; 2; x and y are each greater than zero and are mole percents of the respective polymer units.

3. A photoresist of claim 1 wherein the polymer comprises a structure of the following Formula VII:

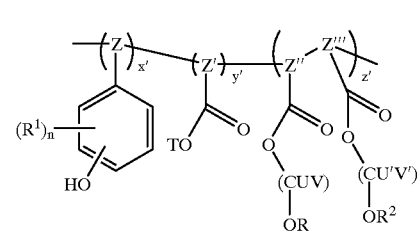

VII

Z, Z', Z" and Z'" are each independently optionally substituted alkylene having 1 to about 10 carbon atoms, optionally substituted alkenyl having 2 to about 10 carbon atoms, or optionally substituted aknyl having from 2 to 10 carbon atoms;

U, V, U' and V' are each independently hydrogen; halogen; substituted or unsubstituted alkyl; substituted or unsubstituted alkenyl; substituted or unsubstituted alkynyl; substituted or substituted alkanoyl; substituted or unsubstituted carbocyclic aryl; substituted or unsubstituted aralkyl; substituted or unsubstituted heterocyclic or heteroaromatic having 1 to 3 ring members and 1 to about 3 hetero atoms; and R and $R^2$ are each independently substituted or unsubstituted alkyl; substituted or unsubstituted alkenyl; substituted or unsubstituted alkynyl; substituted or substituted alkanoyl; substituted or unsubstituted carbocyclic aryl; substituted or unsubstituted aralkyl; substituted or unsubstituted heterocyclic or heteroaromatic having 1 to 3 ring members and 1 to about 3 hetero atoms;

or R and at least one of the U and V groups are taken together with the depicted interposed oxygen to form a ring, or $R^2$ and at least one of the U' and V' groups are taken together with the depicted interposed oxygen to form a ring;

T is group that constitutes at least about 75 mole percent carbon;

each $R^1$ is independently halogen; substituted or unsubstituted alkyl; substituted or unsubstituted alkoxy; substituted or unsubstituted alkenyl; substituted or unsubstituted alkynyl; substituted or unsubstituted alkylthio; cyano; nitro; amino; hydroxyl; or two $R^1$ groups on adjacent carbons may be taken together to form one or more fused aromatic or alicyclic rings having from 4 to about 8 ring members per ring; n is an integer of from 0 to 4; x', y' and z' are each greater than zero and are mole percents of the respective polymer units.

4. A photoresist of claim 3 wherein T is a substituted or unsubstituted alkyl, substituted or unsubstituted aryl, or substituted or unsubstituted aralkyl.

5. A photoresist of claim 3 wherein T is substituted or unsubstituted adamantyl, substituted or unsubstituted norbornyl, substituted or unsubstituted isobornyl, substituted or unsubstituted phenyl, substituted or unsubstituted naphthyl, substituted or unsubstituted acenaphthyl, substituted or unsubstituted benzyl or substituted or unsubstituted benzhydryl.

6. A photoresist of claim 1 wherein the polymer comprises a structure of the following Formula VIII:

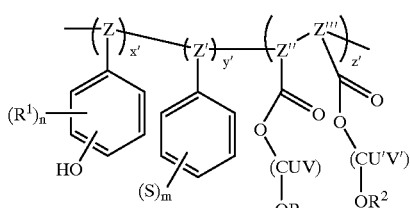

VIII

Z, Z', Z" and Z'" are each independently optionally substituted alkylene having 1 to about 10 carbon atoms, optionally substituted alkenyl having 2 to about 10 carbon atoms, or optionally substituted alkynyl having from 2 to 10 carbon atoms;

U, V, U' and V' are each independently is hydrogen; halogen; substituted or unsubstituted alkyl; substituted or unsubstituted alkenyl; substituted or unsubstituted alkynyl; substituted or substituted alkanoyl; substituted or unsubstituted carbocyclic aryl; substituted or unsubstituted aralkyl; substituted or unsubstituted heterocyclic or heteroaromatic having 1 to 3 ring members and 1 to about 3 hetero atoms; and R and $R^2$ are independently substituted or unsubstituted alkyl; substituted or unsubstituted alkenyl; substituted or unsubstituted alkynyl; substituted or substituted alkanoyl; substituted or unsubstituted carbocyclic aryl; substituted or unsubstituted aralkyl; substituted or unsubstituted heterocyclic or heteroaromatic having 1 to 3 ring members and 1 to about 3 hetero atoms;

or R and at least one of the U and V groups is taken together with the depicted interposed oxygen to form a ring, or $R^2$ and at least one of the U' and V' groups is taken together with the depicted interposed oxygen to form a ring;

each $R^1$ is independently halogen; substituted or unsubstituted alkyl; substituted or unsubstituted alkoxy; substituted or unsubstituted alkenyl; substituted or unsubstituted alkynyl; substituted or unsubstituted alkylthio; cyano; nitro; amino; hydroxyl; or two $R^1$ groups on adjacent carbons are taken together to form one or more fused aromatic or alicyclic rings having from 4 to about 8 ring members per ring;

each S is independently halogen; cyano; nitro; substituted or unsubstituted alkyl; substituted or unsubstituted alkoxy; substituted or unsubstituted alkenyl; substituted or unsubstituted alkynyl; substituted or unsubstituted alkylthio; substituted or unsubstituted carbocyclic aryl; substituted or unsubstituted aralkyl; substituted or unsubstituted heterocyclic or heteroaromatic having 1 to 3 ring members and 1 to about 3 hetero atoms; or a sulfonic acid ester; or two S groups are taken together to form one or more fused aromatic or alicyclic rings having from 4 to about 8 ring members per ring;

m is an integer of 0 to 5; n is an integer of from 0 to 4; x', y' and z' are each greater than zero and are mole percents of the respective polymer units.

* * * * *